US006744068B2

(12) United States Patent
Fossum et al.

(10) Patent No.: US 6,744,068 B2

(45) **Date of Patent: *Jun. 1, 2004**

(54) ACTIVE PIXEL SENSOR WITH INTRA-PIXEL CHARGE TRANSFER

(75) Inventors: Eric R. Fossum, LaCrescenta, CA (US); Sunetra Mendis, Pasadena, CA (US); Sabrina E. Kemeny, LaCrescenta, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/388,250

(22) Filed: Mar. 12, 2003

(65) Prior Publication Data

US 2003/0160238 A1 Aug. 28, 2003

Related U.S. Application Data

(62) Division of application No. 09/604,846, filed on Jun. 27, 2000, now Pat. No. 6,555,842, and a division of application No. 08/558,521, filed on Nov. 16, 1995, now Pat. No. 6,101,232, and a division of application No. 08/188,032, filed on Jan. 28, 1994, now Pat. No. 5,471,515.

(51) Int. Cl.[7] .................................... H01L 29/04

(52) U.S. Cl. ......................... 257/59; 257/59; 257/222; 257/232; 257/234; 257/239; 257/292; 257/294

(58) Field of Search ......................... 257/59, 222, 232, 257/234, 239, 292, 294

(56) References Cited

U.S. PATENT DOCUMENTS 3,623,132 A 11/1971 Green ......................... 377/60
4,093,872 A 6/1978 Hartman et al. .............. 377/60

(List continued on next page.)

FOREIGN PATENT DOCUMENTS

EP 0 700 582 B1 7/1998
JP 5235317 9/1993 ................. 257/258

OTHER PUBLICATIONS

S. Chamberlain, "Photosensitivity and Scanning of Silicon Image Detector Arrays," IEEE J. Solid State Circuits, vol. SC–4, No. 6, pp. 333–342 (Dec. 1969).

M. Aoki et al. "2 3 Inch Format MOS Single–Chip Color Imager," IEEE Trans On Electron Devices, vol. ED–29, No. 4, pp. 745–750 (Apr. 1982).

J. Hynecek, "A New Device Architecture Suitable for High–Resolution and High–Performance Image Senosrs," IEEE Trans. on Electron Devices, vol. 35(5), pp. 646–652 (May 1988).

F. Andoh, et al., "A 250,000–Pixel Image Sensor with FET Amplification at Each Pixel for High–Speed Televison Cameras," 1990 IEEE International Solid–State Circuits Conference, Digest of Technical Papers, pp. 212–213 (Feb. 16, 1990).

(List continued on next page.)

*Primary Examiner*—David Nelms
*Assistant Examiner*—Mai-Huong Tran
(74) *Attorney, Agent, or Firm*—Fish & Richardson P.C.

(57) ABSTRACT

An imaging device formed as a monolithic complementary metal oxide semiconductor integrated circuit in an industry standard complementary metal oxide semiconductor process, the integrated circuit including a focal plane array of pixel cells, each one of the cells including a photogate overlying the substrate for accumulating photo-generated charge in an underlying portion of the substrate, a readout circuit including at least an output field effect transistor formed in the substrate, and a charge coupled device section formed on the substrate adjacent the photogate having a sensing node connected to the output transistor and at least one charge coupled device stage for transferring charge from the underlying portion of the substrate to the sensing node.

7 Claims, 2 Drawing Sheets

U.S. PATENT DOCUMENTS

| | | | | | |
|---|---|---|---|---|---|
| 4,155,094 | A | | 5/1979 | Ohba et al. | 257/292 |
| 4,287,441 | A | | 9/1981 | Smith | 307/353 |
| 4,309,624 | A | | 1/1982 | Hynecek et al. | 257/239 |
| 4,363,963 | A | | 12/1982 | Ando | |
| 4,407,010 | A | * | 9/1983 | Baji et al. | 257/292 |
| 4,525,742 | A | | 6/1985 | Nishizawa et al. | |
| 4,631,400 | A | | 12/1986 | Tanner et al. | |
| 4,660,090 | A | | 4/1987 | Hynecek | |
| 4,683,580 | A | | 7/1987 | Matsunaga | 377/60 |
| 4,835,617 | A | | 5/1989 | Todaka et al. | |
| 4,839,729 | A | | 6/1989 | Ando et al. | |
| 4,839,735 | A | | 6/1989 | Kyomasu et al. | |
| 4,859,624 | A | | 8/1989 | Goto | 257/371 |
| 4,942,474 | A | | 7/1990 | Akimoto et al. | |
| 4,959,727 | A | | 9/1990 | Imaide et al. | |
| 5,097,339 | A | | 3/1992 | Ishida et al. | |
| 5,134,488 | A | | 7/1992 | Sauer | |
| 5,153,421 | A | | 10/1992 | Tandon et al. | |
| 5,182,623 | A | | 1/1993 | Hynecek | |
| 5,184,203 | A | | 2/1993 | Taguchi | 257/370 |
| 5,192,990 | A | | 3/1993 | Stevens | 377/60 |
| 5,198,654 | A | | 3/1993 | Mukainakano et al. | |
| 5,198,880 | A | | 3/1993 | Taguchi et al. | 257/370 |
| 5,225,696 | A | | 7/1993 | Bahraman | |
| 5,262,871 | A | | 11/1993 | Wilder et al. | |
| 5,317,174 | A | | 5/1994 | Hynecek | |
| 5,323,052 | A | | 6/1994 | Koyama | 257/294 |
| 5,335,015 | A | | 8/1994 | Cooper et al. | |
| 5,341,008 | A | | 8/1994 | Hynecek | |
| 5,345,266 | A | * | 9/1994 | Denyer | 348/300 |
| 5,369,039 | A | | 11/1994 | Hynecek | |
| 5,420,634 | A | | 5/1995 | Matsumoto | |
| 5,424,223 | A | | 6/1995 | Hynecek | |
| 5,436,476 | A | | 7/1995 | Hynecek | |
| 5,452,004 | A | | 9/1995 | Roberts | |
| 5,452,109 | A | | 9/1995 | Compton | |
| 5,471,245 | A | | 11/1995 | Cooper et al. | |
| 5,471,515 | A | | 11/1995 | Fossum et al. | |
| 5,495,337 | A | | 2/1996 | Goshorn et al. | |
| 5,541,402 | A | | 7/1996 | Ackland et al. | |
| 5,563,429 | A | * | 10/1996 | Isogai | 257/292 |
| 5,585,620 | A | | 12/1996 | Nakamura et al. | |
| 5,608,204 | A | | 3/1997 | Hofflinger et al. | |
| 5,631,704 | A | | 5/1997 | Dickinson et al. | |
| 5,652,622 | A | | 7/1997 | Hynecek | |

OTHER PUBLICATIONS

N. Tanaka, et al., "A 310K Pixel Bipolar Imager (BASIS)," IEEE Trans. On Electron Devices, vol. 37(4), pp. 964–971 (Apr. 1990).

K. Chen, et al., "PASIC: A Processor–A/D converter–Sensor Integrated Circuit," IEEE ISCAS, pp. 1705–1708 (1990).

O. Yadid–Pecht, et al., "A Random Access Photodiode Array for Intelligent Image Capture," IEEE Trans. on Electron Devices, vol. 38, No. 8, pp. 1772–1780 (Aug. 1991).

M. Kyomasu, "A New MOS Imager Using Photodiode as Current Source," IEEE Journal of SOlid Sate Circuits, vol. 26, No. 8, pp. 1116–1122 (Aug. 1991).

R. Forchheimer, et al., "MAPP2200—A Second generation smart optical sensor," Proc. SPIE, vol. 1659, pp. 2–11 (1992).

C. Jansson, et al., "An Addressable 256 ×256 Photodiode Image Sensor Array with an 8–Bit Digital Output," Analog Integrated Circuits and Signal Processing, vol. 4, pp. 37–49 (1993).

H. Kawashima, et al., "A ¼ Inch Format 250K Pixel Amplified MOS Image Sensor Using CMOS Process," IEEE IEDM Tech. Digest, pp. 22.4.1–22.4.4 (1993).

S. Mendis, et al., "Design of a Low–Light–Level Image Sensor with On–chip Sigma–Delta Analog–to–Digital Conversion," SPIE, Charge Coupled Devices & Solid State Optical Sensors III, vol. 1900, pp. 31–39 (1993).

M. Sugawara, et al., "An Amplified MOS Imager Suited for Image Processing," 1994 IEEE International Solid–State Circuits Conference, Digest of Technical Papers, Session 13, Neural Networks and Image Sensors Paper TP 13.6, pp. 228–229 (1994).

B. Fowler, et al., "A CMOS Area Image Sensors with Pixel–Level A/D Conversion," 1994 IEEE International Solid–State Circuits Conference, Digest of Technical Papers, Neural Networks and Image Sensors/ Paper TP 13.5, pp. 226–227 (1994).

B. Pain, et al., "Approaches and analysis for on–focal–plane analog–to–digital conversion," Proc. SPIE, vol. 2226, pp. 208–218 (1994).

A. Gruss, et al., "Integrated Sensor and Range–Finding Analog Signal Processor," IEEE Journal of Solid State Circuits, vol. 26, No. 3, pp. 184–191 (Mar. 1991).

Renshaw, et al., "ASIC Image Sensors," Proc. IEEE ISCAS, pp. 3038–3041 (1990).

O. Vellacott, "CMOS in camera," IEE Review, pp. 111–114 (May 1994).

I. Muirhead, "Developments in CMOS Camera Technology," published by: IEE, Savoy Place, London WC2R 0BL, UK, pp. 5/1–5/4 (1994).

I. Takayanagi, et al., "A Multiple Output CMD Imager for Real–Time Image Processing," IEEE, IEDM, pp. 22.5.1–22.5.4 (1993).

M. White, et al., "Characterization of Surface Channel CCD Image Arrays at Low Light Levels," IEEE Journal of Soild–State Circuits, vol. SC–9, No. 1, pp. 1–13 (Feb. 1974).

W. Yang, et al., "A full–fill factor CCD imager with integrated signal processors." IEEE International Solid–State Circuits Conference Digest of Technical Papers, pp. 218–219 and 300 (Feb. 16, 1990).

R. Forchheimer, "Single–chip image sensors with a digital processor array," Journal of VLSI Signal Processing, vol. 5. pp. 121–131 (1993).

E. Fossum, et al., "Development of CMOS Active Pixel Image Sensors for Low Cost Commerical Applications," Conference Proceedings of NASA Technology 2004, pp. 1–2 (Nov. 1994).

E. Fossum, et al., "Application of the active pixel sensor concept to guidance and navigation," SPIE, vol. 1949, Space Guidance, Control and Tracking, paper 30, pp. 1–8 (1993).

E. Fossum,"Assessment of Image Sensor Technology for Future NASA Missions," Proceedings of the SPIE, vol. 2172, Charge–Coupled Devices and Solid–State Optical Sensors IV, pp. 1–16 (1994).

T. Kuriyama, et al., "A ⅓–in 270 000 Pixel CCD Image Sensor," IEEE Transaction on Electron Devices, Special Issue on Solid State Image Sensors, vol. 38, No. 5, pp. 949–953 (May 1991).

J. Hojo, et al., "A ⅓–in 510(H) × 492(V) CCD Image Sensor with Mirror Image Function," IEEE Transaction on Electron Devices, Special Issue on Solid State Image Sensors, vol. 38, No. 5, pp. 954–959 (May 1991).

H. Ando, et al., "A ½–in CCD Imager with Lateral Overflow–Gate Shutter," IEEE Transaction on Electron Devices, Special Issue on Solid State Image Sensors, vol. 38, No. 5, pp. 960–964 (May 1991).

A. Toyoda, et al., "A Novel Tungsten Light–Shield Structure for High–Density CCD Image Sensors," IEEE Transaction on Electron Devices, Special Issue on Solid State Image Sensors. vol. 38, No. 5, pp. 965–968 (May 1991).

T. Ozaki, et al., "A Low–Noise Line–Amplified MOS Imaging Devices," IEEE Transaction on Electron Devices, Special Issue on Solid State Image Sensors, vol. 38, No. 5, pp. 969–975 (May 1991).

M. Yamagishi, et a., "A 2 Million Pixel FIT–CCD Image Sensor for HDTV Camera Systems." IEEE Transaction on Electron Devices, Special Issue on Solid State Image Sensors, vol. 38, No. 5, pp. 976–980 (May 1991).

E. Stevens, et al., "A 1–Megapixel, Progressive–Scan Image Sensor with Antiblooming Control and Lag–Free Operation," IEEE Transaction on Electron Devices, Special Issue on Solid State Image Sensors, vol. 38, No. 5, pp. 981–988 (May 1991).

K. Matsumoto, et al., "The Operation Mechanism of a Charge Modulation Device (CMD) Image Sensor," IEEE Transaction on Electron Devices, Special Issue on Solid State Image Sensors, vol. 38, No. 5, pp. 989–998 (May 1991).

K. Matsumoto et al., "Analysis of Operational Speed and Scaling Down the Pixel Size of a Charge Modulation Device (CMD) Image Sensor," IEEE Transaction on Electron Devices, Special Issue on Solid State Image Sensors, vol. 38, No. 5, pp. 999–1004 (May 1991).

M. Ogata, "A Small Pixel CMD Image Sensor," IEEE Transaction on Electron Devices, Special Issue on Solid State Image Sensors, vol. 38, No. 5, pp. 1005–1010 (May 1991).

Hynecek, "BCMD—An Improved Photosite Structure for High–Density Image Sensors," IEEE Transactions on Electron Devices, vol. 38(5), pp. 1011–1020 (May 1991).

T. Mizoguchi, et al., "A 250 k–Pixel SIT Image Sensor Operating in its High–Sensitivity Mode," IEEE Transaction on Electron Devices, Special Issue on Solid State Image Sensors, vol. 38, No. 5, pp. 1021–1027 (May 1991).

Y. Nakamura, et al., "Design of Bipolar Imaging Device (BASIS)," IEEE Transaction on Electron Devices, Special Issue on Solid State Image Sensors, vol. 38, No. 5, pp. 1028–1036 (May 1991).

M. Miyawaki et al., "Reduction of Fixed–Pattern Noise of BASIS Due to Low Kinetic Energy Reactive Ion to Low Kinetic Energy Reactive Ion and Native–Oxide–Free Processing," IEEE Transaction on Electron Devices, Special Issue on Solid State Image Sensors, vol. 38, No. 5, pp. 1037–1043 (May 1991).

Y. Matsunaga, et al., "A High–Sensitivity MOS Photo–Transistor for Area Image Sensor," IEEE Transaction on Electron Devices, Special Issue on Solid State Image Sensors, vol. 38, No. 5, pp. 1044–1047 (May 1991).

N. Mutoh, et al., "New Low–Noise Output Amplifier for High–Definition CCD Image Sensor," IEEE Transaction on Electron Devices, Special Issue on Solid State Image Sensors, vol. 38, No. 5, pp. 1048–10551 (May 1991).

M. Tabei, et al., "A New CCD Architecture of High–Resolution and Sensitivity for Color Digital Still Picture," IEEE Transaction on Electron Devices, Special Issue on Solid State Image Sensors, vol. 38, No. 5, pp. 1052–1058 (May 1991).

J. Bosiers, et al., "A ⅔–in 1887(H)×581(V) S–VHS–Compatible Frame–Transfer CCD for ESP and Movie Mode," IEEE Transaction on Electron Devices, Special Issue on Solid State Image Sensors, vol. 38, No. 5, pp. 1059–1068 (May 1991).

B. Burke, "An Abuttable CCD Imager for Visible and X–Ray Focal Plane Arrays," IEEE Transaction on ELectron Devices, Special Issue on Solid State Image Sensors, vol. 38, No. 5, pp. 1069–1076 (May 1991).

E. Garcia, "CCD Arrays for Readout of Electrophotographic Latent Images,"IEEE Transaction on Electron Devices, Special Issue on Solid State Image Sensors, vol. 38, No. 5, pp. 1077–1085 (May 1991).

T. Kaneko, et al., "400 dpi Integrated Contact Type Linear Image Sensors with Poly–Si TFT's Analog Readout Circuits and Dynamic Shift Registers," IEEE Transaction on Electron Devices, Special Issue on Solid State Image Sensors, vol. 38, No. 5, pp. 1086–1093 (May 1991).

C. K. Chen, et al., "Ultraviolet, Visible, and Infrared Response of PtSi Schottky–Barrier Detectors Operated in the Front–Illuminated Mode," IEEE Transaction on Electron Devices, Special Issue on Solid State Image Sensors, vol. 38, No. 5, pp. 1094–1103 (May 1991).

R. B. Bailey, et al., "256×256 Hybrid HgCdTe Infrared Focal Plane Arrays," IEEE Transaction on Electron Devices, Special Issue on Solid State Image Sensors, vol. 38, No. 5, pp. 1104–1109 (May 1991).

H. Zogg, et al., "Infrared Sensor Arrays with 3–12 $\mu$m Cutoff Wavelengths in Heteroepitaxial Narrow–Gap Semiconductor on Silicon Substrates," IEEE Transaction on Electron Devices, Special Issue on Solid State Image Sensors, vol. 38, No. 5, pp. 1110–1117 (May 1991).

C. G. Bethea, et al., "10–$\mu$m GaAs / AlGaAs Multiquantum Well Scanned Array Infrared Imaging Camera," IEEE Transaction on Electron Devices, Special Issue on Solid State Image Sensors, vol. 38, No. 5, pp. 1118–1123 (May 1991).

L. J. Kozlowski, et al., "LWIR 128×128 GaAs / AlGaAs Multiple Quantum Well Hybrid Focal Plane Array,"IEEE Transaction on Electron Devices, Special Issue on Solid State Image Sensors, vol. 38, No. 5, pp. 1124–1130 (May 1991).

M. Denda, et al., "4–Band×4096–Element Schottky–Barrier Infrared Linear Image Sensor," IEEE Transaction on Electron Devices, Special Issue on Solid State Image Sensors, vol. 38, No. 5, pp. 1131–1135 (May 1991).

S. Tohyama, et al., "A New Concept Silicon Homojunction Infrared Sensor," IEEE Transaction on Electron Devices, Special Issue on Solid State Image Sensors, vol. 38, No. 5, pp. 1136–1140 (May 1991).

T–L Lin, et al., "SiGe / Si Heterojunction Internal Photoemission Long–Wavelength Infrared Detectors Fabricated by Molecular Beam Epitaxy,"IEEE Transaction on Electron Devices, Special Issue on Solid State Image Sensors, vol. 38, No. 5, pp. 1141–1144 (May 1991).

M. Okuyama, et al., "Room–Temperature–Operated Infrared Image CCD Sensor Using Pyroelectric Gate Coupled by Dielectric Connector," IEEE Transaction on Electron Devices, Special Issue on Solid State Image Sensors, vol. 38, No. 5, pp. 1145–1151 (May 1991).

J.G.C. Bakker, "Simple Analytical Expressions for the Fringing Field and Fringing–Field–Induced Transfer Time in Charge–Coupled Devices," IEEE Transaction on Electron Devices, Special Issue on Solid State Image Sensors, vol. 38, No. 5, pp. 1152–1161 (May 1991).

E. K. Banghart, et al., "A Model for Charge Transfer in Buried–Channel Charge–Couple Devices at Low Temperature," IEEE Transaction on Electron Devices, Special Issue on Solid State Image Sensors, vol. 38, No. 5, pp. 1162–1174 (May 1991).

C. R. Hoople, et al, "Characteristics of Submicrometer Gaps in Buried–Channel CCD Structures," IEEE Transaction on Electron Devices, Special Issue on Solid State Image Sensors, vol. 38, No. 5, pp. 1175–1181 (May 1991).

E.R. Fossum, et al., "Two–Dimesional Electron Gas Charge–Coupled Devices (2DEG–CCD's)," IEEE Transaction on Electron Devices, Special Issue on Solid State Image Sensors, vol. 38, No. 5, pp. 1182–1192 (May 1991).

J.G.C. Bakker, et al, "The Tacking CCD: A New CCD Concept,"IEEE Transaction on Electron Devices, Special Issue on Solid State Image Sensors, vol. 38, No. 5, pp. 1193–1200 (May 1991).

S. Takayama, et al., "A Dynamic Model of an a–Si:H Photoconductive Sensor," IEEE Transaction on Electron Devices, Special Issue on Solid State Image Sensors, vol. 38, No. 5, pp. 1201–1205 (May 1991).

P. Centen, "CCD On–Chip Amplifiers: Noise Performance versus MOS Transistor Dimensions," IEEE Transaction on Electron Devices, Special Issue on Solid State Image Sensors, vol. 38, No. 5, pp. 1206–1216 (May 1991).

N. Ozawa, et al., "A Correlative Coefficient Multiplying (CCM) Method for Chrominance Moire Reduction in Single–Chip Color Video Cameras," IEEE Transaction on Electron Devices, Special Issue on Solid State Image Sensors, vol. 38, No. 5, pp. 1217–1225 (May 1991).

Y.T. Tsai, "Color Image Compression for Single–Chip Cameras," IEEE Transaction on Electron Devices, Special Issue on Solid State Image Sensors, vol. 38, No. 5, pp. 1226–1232 (May 1991).

P. Noble, "Self–Scanned Silicon Image Detector Arrays," IEEE Trans. on Electron Devices, vol. ED–15, No. 4, pp. 202–209 (Apr. 1968).

J. Nishizawa, et al., "Static Induction Transistor Image Sensors," IEEE Trans. on Electron Devices, vol. ED–26(12), pp. 1970–1977 (Dec. 1979).

K. Matsumoto, et al., "A New MOS Phototransistor Operating in an Non–Destructive Readout Mode," Jpn. J. Appl. Phys., vol. 24, No. 5, pp. L323–L325 (1985).

H. Ando, et al., "Design Consideration and Performance of a New MOS Imaging Device," IEEE Trans. on Electron Devices, vol. ED–32, No. 8, pp. 1484–1489 (Aug. 1985).

T. Nakamura, et al., "A New MOS Image Sensor Operating in a Non–Destructive Readout Mode," IEDM Tech. Dig., pp. 353–356 (1986).

A. Yusa, et al., "SIT Image Sensor: Design Considerations and Characteristics" IEEE Trans. on Electron Devices, vol. ED–33, No. 6, pp. 735–742 (Jun. 1986).

N. Tanaka, et al., "A Novel Bipolar Imagine Device with Self–Noise–Reduction Capability," IEEE Trans. on Electron Devices, vol. 36(1), pp. 31–38 (Jan. 1989).

Z. Huang, et al., "A Novel Amplified Image Sensor with a–Si:H Photoconductor and MOS Transistor," IEEE Trans. on Electron Devices, vol. 37, No. 6, pp. 1432–1438 (Jun. 1990).

Y. Nakamura, et al., "Design of Bipolar Imaging Devices (BASIS): Analysis of Random Noise," IEEE Trans. on Electron Devices, vol. 39(6), pp. 1341–1349 (Jun. 1992).

E. Fossum, "Active–pixel sensors challenge CCDs," Laser Focus World, vol. 29, pp. 83–87 (Jun. 1993).

S. Mendis, et al., "A 128×128 CMOS Active Pixel Image Sensor for Highly Integrated Imaging Systems," Proc. of the 1993 IEEE International Electron Devices Meeting, pp. 583–586 (1993).

S. Mendis, et al., "Progress in CMOS Active Pixel Image Sensors," Proc. SPIE, vol. 2172, pp. 19–29(1994).

S. Mendis, et al., "CMOS Active Pixel Image Sensor," IEEE Trans. on Electron Devices, vol. 41, No. 3, pp. 452–453 (Mar. 1994).

T. Kinugasa, et al., "An Electronic Variable–Shutter System in Video Camera Use," IEEE Transactions on Consumer Electronics, vol. CE–33, No. 3, 249–255 (1987).

S. Mendis, et al., "CMOS Active Pixel Image Sensor," Citation Unknown, pp. 1–7 (Jul. 1993).

Renshaw, D., et al., "ASIC Vision," Custom Integrated Circuits Conference, IEEE, pp. 7.3.1–7.3.4 (May 1990).

Anderson, S., et al., "A Single Chip Sensor & Image Processor for Fingerprint Verification," Custom Integrated Circuits Conference, IEEE, pp. 12.1.1–12.1.4 (1991).

Wang, G., et al., "CMOS Video Camera," University of Edinburgh, IEEE, pp. 100–132, (Mar. 1991).

Denyer, P.B., et al., "CMOS Image Sensors for Multimedia Applications," Custom Integrated Circuits Conference, IEEE, pp. 11.5.1–11.5.4 (Mar. 1993).

Eric R. Fossum, "Active Pixel Sensors: Are CCD's Dinosaurs?," Proceedings of the SPIE, vol. 1990, Charge–Coupled Devices and Solid–State Optical Sensors III, pp. 1–13 (1993).

* cited by examiner

ACTIVE PIXEL SENSOR WITH INTRA-PIXEL CHARGE TRANSFER

CROSS-REFERENCE TO RELATED APPLICATIONS

This application is a of application Ser. No. 09/604,846 filed on Jun. 27, 2000, now U.S. Pat. No. 6,555,842 and U.S. application Ser. No. 08/558,521 filed Nov. 16, 1995, now U.S. Pat. No. 6,101,232 issued Aug. 8, 2000, and U.S. application Ser. No. 08/188,032 filed Jan. 28, 1994, now U.S. Pat. No. 5,471,515 issued Nov. 28, 1995.

ORIGIN OF THE INVENTION

The invention described herein was made in the performance of work under a NASA contract, and is subject to the provisions of Public Law 96-517 (35 USC 202) in which the Contractor has elected to retain title.

BACKGROUND OF THE INVENTION

1. Technical Field

The invention is related to semiconductor imaging devices and in particular to a silicon imaging device which can be fabricated using a standard CMOS process.

2. Background Art

There are a number of types of semiconductor imagers, including charge coupled devices, photodiode arrays, charge injection devices and hybrid focal plane arrays. Charge coupled devices enjoy a number of advantages because they are an incumbent technology, they are capable of large formats and very small pixel size and they facilitate noiseless charge domain processing techniques (such as binning and time delay integration). However, charge coupled device imagers suffer from a number of disadvantages. For example, they exhibit destructive signal read-out and their signal fidelity decreases as the charge transfer efficiency raised to the power of the number of stages, so that they must have a nearly perfect charge transfer efficiency. They are particularly susceptible to radiation damage, they require good light shielding to avoid smear and they have high power dissipation for large arrays.

In order to ameliorate the charge transfer inefficiency problem, charge coupled device (CCD) imagers are fabricated with a specialized CCD semiconductor fabrication process to maximize their charge transfer efficiency. The difficulty is that the standard CCD process is incompatible with complementary metal oxide semiconductor (CMOS) processing, while the image signal processing electronics required for the imager are best fabricated in CMOS. Accordingly, it is impractical to integrate on-chip signal processing electronics in a CCD imager. Thus, the signal processing electronics is off-chip. Typically, each column of CCD pixels is transferred to a corresponding cell of a serial output register, whose output is amplified by a single on-chip amplifier (e.g., a source follower transistor) before being processed in off-chip signal processing electronics. As a result, the read-out frame rate is limited by the rate at which the on-chip amplifier can handle charge packets divided by the number of pixels in the imager.

The other types of imager devices have problems as well. Photodiode arrays exhibit high noise due to so-called kTC noise which makes it impossible to reset a diode or capacitor node to the same initial voltage at the beginning of each integration period. Photodiode arrays also suffer from lag. Charge injection devices also suffer from high noise, but enjoy the advantage of non-destructive readout over charge coupled devices.

Hybrid focal plane arrays exhibit less noise but are prohibitively expensive for many applications and have relatively small array sizes (e.g., 512-by-512 pixels).

What is needed is an imager device which has the low kTC noise level of a CCD without suffering from the destructive readout tendencies of a CCD.

SUMMARY OF THE DISCLOSURE

The invention is embodied in an imaging device formed as a monolithic complementary metal oxide semiconductor integrated circuit in an industry standard complementary metal oxide semiconductor process, the integrated circuit including a focal plane array of pixel cells, each one of the cells including a photogate overlying the substrate for accumulating photo-generated charge in an underlying portion of the substrate, a readout circuit including at least an output field effect transistor formed in the substrate, and a charge coupled device section formed on the substrate adjacent the photogate having a sensing node connected to the output transistor and at least one charge coupled device stage for transferring charge from the underlying portion of the substrate to the sensing node.

In a preferred embodiment, the sensing node of the charge coupled device stage includes a floating diffusion, and the charge coupled device stage includes a transfer gate overlying the substrate between the floating diffusion and the photogate. This preferred embodiment can further include apparatus for periodically resetting a potential of the sensing node to a predetermined potential, including a drain diffusion connected to a drain bias voltage and a reset gate between the floating diffusion and the drain diffusion, the reset gate connected to a reset control signal.

Preferably, the output transistor is a field effect source follower transistor, the floating diffusion being connected to a gate of the source follower transistor. Preferably, the readout circuit further includes a double correlated sampling circuit having an input node connected to the output transistor. In the preferred implementation, the double correlated sampling circuit samples the floating diffusion immediately after it has been reset at one capacitor and then, later, at the end of the integration period at another capacitor. The difference between the two capacitors is the signal output. In accordance with a further refinement, this difference is corrected for fixed pattern noise by subtracting from it another difference sensed between the two capacitors while they are temporarily shorted.

DETAILED DESCRIPTION OF THE PREFERRED EMBODIMENTS

Figure 1:
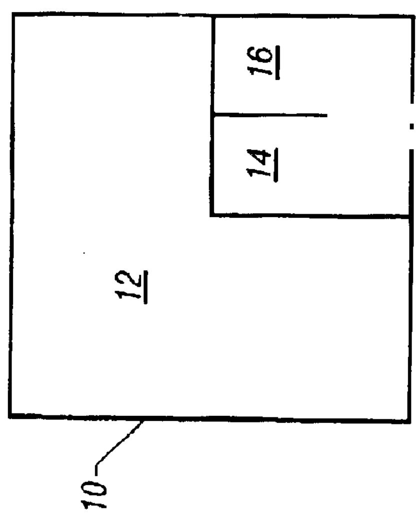
FIG. 1 is a diagram illustrating the architecture of an individual focal plane cell of the invention.
Figure 2:
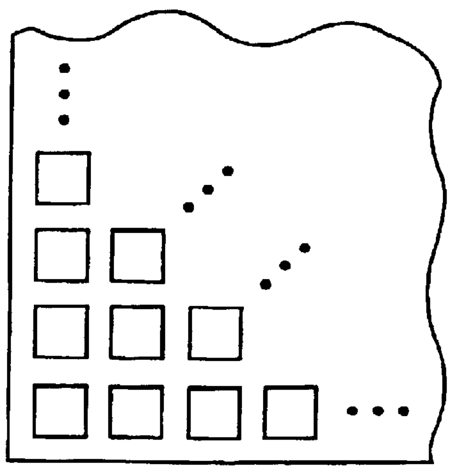
FIG. 2 is a plan view of an integrated circuit constituting a focal plane array of cells of the type illustrated in FIG. 1.
Figure 3:
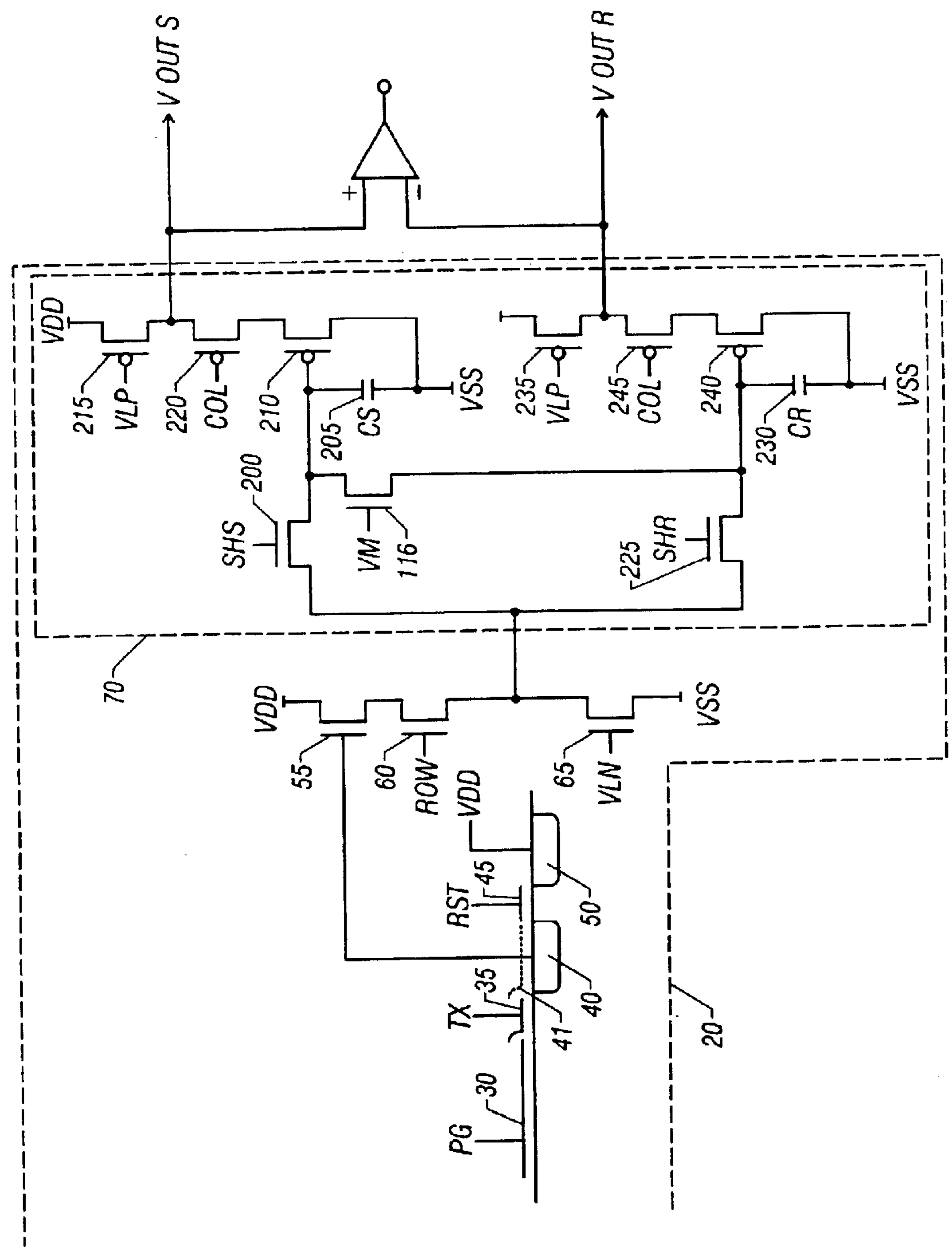
FIG. 3 is a schematic diagram of the cell of FIG. 1.

FIG. 1 is a simplied block diagram of one pixel cell 10 of a focal plane array of many such cells formed in an integrated circuit. Each cell 10 includes a photogate 12, a charge transfer section 14 adjacent the photogate 12 and a readout circuit 16 adjacent the charge transfer section 14. FIG. 2 shows a focal plane array of many cells 10 formed on a silicon substrate 20. FIG. 3 is a simplified schematic diagram of a cell 10. Referring to FIG. 3, the photogate 12 consists of a relative large photogate electrode 30 overlying the substrate 20. The charge transfer section 14 consists of a transfer gate electrode 35 adjacent the photogate electrode 30, a floating diffusion 40, a reset electrode 45 and a drain diffusion 50. The readout circuit 16 consists of a source follower field effect transistor (FET) 55, a row select FET 60, a load FET 65 and a correlated double sampling circuit 70.

Figure 4:
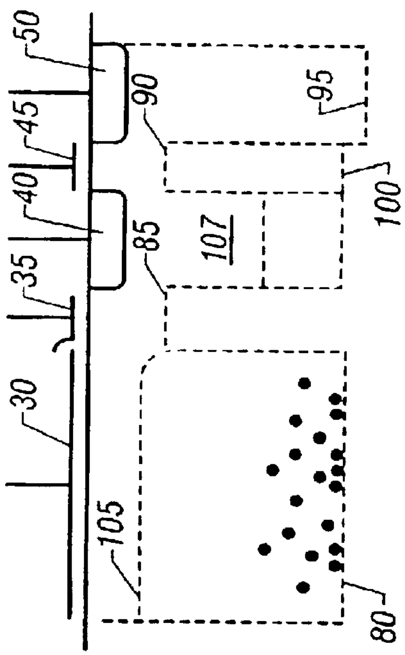
FIG. 4 is a graph of the surface potential in the the charge transfer section of the cell of FIG. 3

Referring to the surface potential diagram of FIG. 4, the photogate electrode 30 is held by a photogate signal PG at a positive voltage to form a potential well 80 in the substrate 20 in which photo-generated charge is accumulated during an integration period. The transfer gate electrode 35 is initially held at a less positive voltage by a transfer gate signal TX to form a potential barrier 85 adjacent the potential well 80. The floating diffusion 40 is connected to the gate of the source follower FET 55 whose drain is connected to a drain supply voltage VDD. The reset electrode 45 is initially held by a reset signal RST at a voltage corresponding to the voltage on the transfer gate 30 to form a potential barrier 90 thereunder. The drain supply voltage VDD connected to the drain diffusion 50 creates a constant potential well 95 underneath the drain diffusion 50.

During the integration period, electrons accumulate in the potential well 80 in proportion to photon flux incident on the substrate 20 beneath the photogate electrode 30. At the end of the integration period, the surface potential beneath the floating diffusion 40 is quickly reset to a potential level 100 slightly above the potential well 95. This is accomplished by the reset signal RST temporarily increasing to a higher positive voltage to temporarily remove the potential barrier 90 and provide a downward potential staircase from the transfer gate potential barrier 85 to the drain diffusion potential well 95, as indicated in the drawing of FIG. 4. After the reset gate 45 is returned to its initial potential (restoring the potential barrier 90), the readout circuit 70 briefly samples the potential of the floating diffusion 40, and then the cell 10 is ready to transfer the photo-generated charge from beneath the photogate electrode 30. For this purpose, the photogate signal PG decreases to a less positive voltage to form a potential barrier 105 beneath the photogate electrode 30 and thereby provide a downward staircase surface potential from the photogate electrode 30 to the potential well 100 beneath the floating diffusion 40. This transfers all of the charge from beneath the photogate electrode 30 to the floating diffusion 40, changing the potential of the floating diffusion 40 from the level (100) at which it was previously reset to a new level 107 indicative of the amount of charge accumulated during the integration period. This new potential of the floating diffusion 40 is sensed at the source of the source follower FET 55. However, before the readout circuit 70 samples the source of the source follower FET 55, the photogate signal PG returns to its initial (more positive) voltage. The entire process is repeated for the next integration period.

The readout circuit 70 consists of a signal sample and hold (S/H) circuit including an S/H FET 200 and a signal store capacitor 205 connected through the S/H FET 200 and through the row select FET 60 to the source of the source follower FET 55. The other side of the capacitor 205 is connected to a source bias voltage VSS. The one side of the capacitor 205 is also connected to the gate of an output FET 210. The drain of the output FET is a connected through a column select FET 220 to a signal sample output node VOUTS and through a load FET 215 to the drain voltage VDD. A signal called "signal sample and hold" (SHS) briefly turns on the S/H FET 200 after the charge accumulated beneath the photogate electrode 30 has been transferred to the floating diffusion 40, so that the capacitor 205 stores the source voltage of the source follower FET 55 indicating the amount of charge previously accumulated beneath the photogate electrode 30.

The readout circuit 70 also consists of a reset sample and hold (S/H) circuit including an S/H FET 225 and a signal store capacitor 230 connected through the S/H FET 225 and through the row select FET 60 to the source of the source follower FET 55. The other side of the capacitor 230 is connected to the source bias voltage VSS. The one side of the capacitor 230 is also connected to the gate of an output FET 240. The drain of the output FET 240 is connected through a column select FET 245 to a reset sample output node VOUTR and through a load FET 235 to the drain voltage VDD. A signal called "reset sample and hold" (SHR) briefly turns on the S/H FET 225 immediately after the reset signal RST has caused the resetting of the potential of the floating diffusion 40, so that the capacitor 230 stores the voltage at which the floating diffusion has been reset to.

The readout circuit provides correlated double sampling of the potential of the floating diffusion, in that the charge integrated beneath the photogate 12 each integration period is obtained at the end of each integration period from the difference between the voltages at the output nodes VOUTS and VOUTR of the readout circuit 70. This eliminates the effects of kTC noise because the difference between VOUTS and VOUTR is independent of any variation in the reset voltage RST, a significant advantage.

Figure 5:
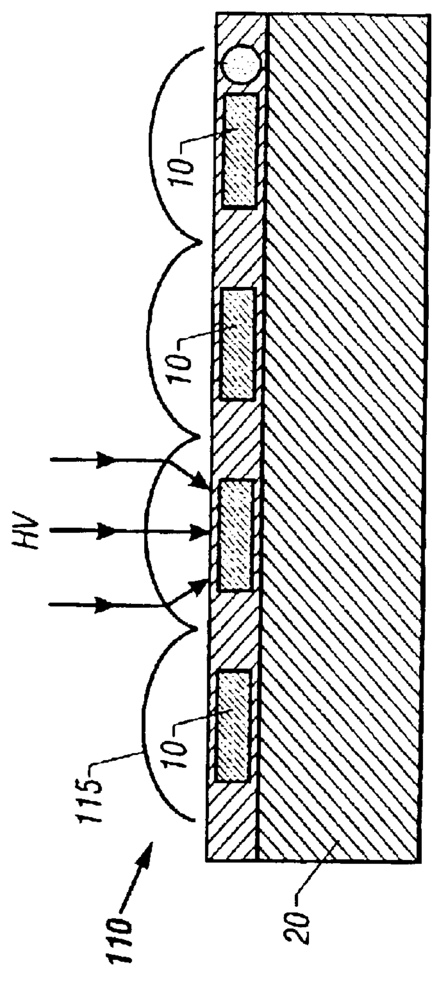
FIG. 5 is a cross-sectional view of an alternative embodiment of the focal plane array of FIG. 2 including a micro-lens layer.

Referring to FIG. 5, a transparent refractive microlens layer 110 may be deposited over the top of the focal plane array of FIG. 2. The microlens layer 110 consists of spherical portions 115 centered over each of the cells 10 and contoured so as to focus light toward the center of each photogate 12. This has the advantage of using light that would otherwise fall outside of the optically active region of the photogate 12. For example, at least some of the light ordinarily incident on either the charger transfer section 14 or the readout circuit 16 (FIG. 1) would be sensed in the photogate area with the addition of the microlens layer 110.

Preferably, the focal plane array corresponding to FIGS. 1–4 is implemented in CMOS silicon using an industry standard CMOS fabrication process. Preferably, each of the FETs is a MOSFET, the FETs 55, 60, 65, 200 and 225 being n-channel devices and the FETs 210, 220, 225, 230. 240, 245 being p-channel devices. The n-channel MOSFETS and the CCD channel underlying the gate electrodes 30, 35, 45 and the diffusions 40 and 50 may be located in a p-well while the remaining (p-channel) devices are located outside of the p-well. The gate voltage VLP applied to the gates of the p-channel load FETs 215 and 235 is a constant voltage on the order of +2.5 volts. The gate voltage VLN applied to the n-channel load FET 65 is a constant voltage on the order of +1.5 volts.

Since the charge transfer section 14 involves only a single CCD stage between the photogate 12 and the floating diffusion 40 in the specific embodiment of FIG. 3, there is no loss due to charge transfer inefficiency and therefore there is no need to fabricate the device with a special CCD process. As a result, the readout circuit 70 as well as the output circuitry of the FETs 55, 60 and 65 can be readily implemented as standard CMOS circuits, making them extremely inexpensive. However, any suitable charge coupled device architecture may be employed to implement the charge transfer section 14, including a CCD having more than one stage. For example, two or three stages may be useful for buffering two or three integration periods.

Other implementations of the concept of the invention may be readily constructed by the skilled worker in light of the foregoing disclosure. For example, the floating diffusion 40 may instead be a floating gate electrode. The signal and reset sample and hold circuits of the readout circuit 70 may be any suitable sample and hold circuits. Moreover, shielding of the type well-known in the art may be employed defining an aperture surrounding the photogate 12. Also, the invention may be implemented as a buried channel device.

Another feature of the invention which is useful for eliminating fixed pattern noise due to variations in FET threshold voltage across the substrate 20 is a shorting FET 116 across the sampling capacitors 205, 235. After the accumulated charge has been measured as the potential difference between the two output nodes VOUTS and VOUTR, a shorting signal VM is temporarily applied to the gate of the shorting FET 116 and the VOUTS-to-VOUTR difference is measured again. This latter difference is a measure of the disparity between the threshold voltages of the output FETs 210, 240, and may be referred to as the fixed pattern difference. The fixed pattern difference is subtracted from the difference between VOUTS and VOUTR measured at the end of the integration period, to remove fixed pattern noise.

As previously mentioned herein, a floating gate may be employed instead of the floating diffusion 40. Such a floating gate is indicated schematically in FIG. 3 by a simplified dashed line floating gate electrode 41.

Preferably, the invention is fabricated using an industry standard CMOS process, so that all of the dopant concentrations of the n-channel and p-channel devices and of the various diffusions are in accordance with such a process. In one implementation, the area of the L-shaped photogate 12 (i.e., the photogate electrode 30) was about 100 square microns; the transfer gate electrode 35 and the reset gate electrode were each about 1.5 microns by about 6 microns; the photogate signal PG was varied between about +5 volts (its more positive voltage) and about 0 volts (its less positive voltage; the transfer gate signal TX was about +2.5 volts; the reset signal RST was varied between about +5 volts (its more positive voltage) and about +2.5 volts (its less positive voltage); the drain diffusion 50 was held at about +5 volts.

While the invention has been described in detail by specific reference to preferred embodiments, it is understood that variations and modifications may be made without departing from the true spirit and scope of the invention.

What is claimed is:

1. An imaging device, comprising:

a plurality of pixel cells, each of said cells comprising:

a substrate;

a photoreceptor, coupled to said substrate, to control accumulating photo-generated charge; and a readout circuit comprising at least a buffering transistor configured as a follower to receive charge from said photoreceptor, and a selecting transistor, operating to select said each cell for readout; and wherein said transistors in said readout circuit are formed of an integrated circuit technology which is compatible with complimentary metal oxide semiconductor (CMOS) technology, said substrate being of a first conductivity type, said readout circuit comprising transistors of a first conductivity type, a well region of a second conductivity type in said substrate and plural semiconductor transistors of a second conductivity type formed in said well region.

2. An imaging device as in claim 1, further comprising a microlens layer formed on at least part of the substrate to refract light incident on an area of the substrate that includes circuitry including at least said readout circuit, to the photoreceptor.

3. A device as in claim 1, further comprising a correlated double sampling circuit, obtaining a sample at a first time, prior to scene integration, obtains a second sample at a second time after scene integration, and produces an output indicative of a difference therebetween.

4. A device as in claim 3, wherein said correlated double sampling circuit which is formed with transistors of complementary types.

5. An imaging device, comprising a plurality of pixel cells, each pixel cell comprising a photoreceptor, configured to receive light from a single pixel of a scene being imaged, a follower transistor, receiving information from said photoreceptor indicative of said light, a select transistor, selecting said each pixel cell for readout, said select transistor being energized to allow said information from said photoreceptor indicative of said light to be output, wherein said photoreceptor, said follower transistor, and said select transistor are each formed of formation processes which are compatible with CMOS technology; and an associated device, associate with processing said light from said photoreceptors, formed in said substrate adjacent said plurality of pixels cells, and connected to receive said information from said pixels cells, wherein said associated device is formed of a plurality of CMOS transistors.

6. An imaging device as in claim 5 wherein said associated device is an image processing device.

7. An imaging device as in claim 5, wherein said associated device is a correlated double sampling device.

* * * * *